(12) United States Patent
Aono et al.

(10) Patent No.: US 7,400,017 B2
(45) Date of Patent: Jul. 15, 2008

(54) REVERSE CONDUCTING SEMICONDUCTOR DEVICE AND A FABRICATION METHOD THEREOF

(75) Inventors: Shinji Aono, Tokyo (JP); Aya Yamamoto, deceased, late of Nara (JP); by Kenzo Yamamoto, legal representative, Nara (JP); by Ikuko Yamamoto, legal representative, Nara (JP); Hideki Takahashi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 668 days.

(21) Appl. No.: 11/076,872

(22) Filed: Mar. 11, 2005

(65) Prior Publication Data

US 2005/0258493 A1 Nov. 24, 2005

(30) Foreign Application Priority Data

Apr. 28, 2004 (JP) .............................. 2004-133698

(51) Int. Cl.
*H01L 29/06* (2006.01)

(52) U.S. Cl. .................. 257/370; 257/38; 257/152; 257/197

(58) Field of Classification Search ............... 257/38, 257/152, 197, 370
See application file for complete search history.

(56) References Cited

U.S. PATENT DOCUMENTS

| | | | |
|---|---|---|---|
| 5,086,324 A | 2/1992 | Hagino | |
| 6,040,599 A | 3/2000 | Takahashi | |
| 6,051,850 A | 4/2000 | Park | |
| 6,177,713 B1 | 1/2001 | Aono et al. | |
| 6,221,721 B1 | 4/2001 | Takahashi | |
| 6,323,509 B1 * | 11/2001 | Kusunoki | .................. 257/146 |
| 6,603,189 B2 | 8/2003 | Takahashi | |
| 6,639,295 B2 | 10/2003 | Majumdar et al. | |
| 2003/0201454 A1 | 10/2003 | Francis et al. | |

FOREIGN PATENT DOCUMENTS

| | | |
|---|---|---|
| DE | 689 26 098 | 11/1996 |
| DE | 199 08 477 | 2/2000 |
| DE | 101 60 118 | 10/2002 |
| DE | 696 34 594 | 2/2006 |
| EP | 1 014 453 | 6/2000 |
| JP | 8-046221 | 2/1996 |
| JP | 3072753 | 6/2000 |
| JP | 2002-076017 | 3/2002 |
| JP | 3435166 | 5/2003 |
| WO | 99/09600 | 2/1999 |

* cited by examiner

*Primary Examiner*—Kieu-Oanh Bui
(74) *Attorney, Agent, or Firm*—Buchanan Ingersoll & Rooney PC

(57) ABSTRACT

To provide a reverse conducting semiconductor device in which an insulated gate bipolar transistor and a free wheeling diode excellent in recovery characteristic are monolithically formed on a substrate, the free wheeling diode including; a second conductive type base layer to constitute the insulated gate bipolar transistor; a first conductive type base layer for constituting the insulated gate bipolar transistor, an anode electrode which is an emitter electrode covering a first conductive type emitter layer and the second conductive type base layer, a cathode electrode which is a collector electrode covering the first conductive type base layer and a second conductive type collector layer formed on the part of the first conductive type base layer, wherein a short lifetime region is formed on a part of the first conductive type base layer.

11 Claims, 12 Drawing Sheets

REVERSE CONDUCTING SEMICONDUCTOR DEVICE AND A FABRICATION METHOD THEREOF

BACKGROUND OF THE INVENTION

1. Field of the Invention

The present invention relates to a reverse conducting semiconductor device in which an insulated gate bipolar transistor and a free wheeling diode are monolithically formed on a substrate as a single piece and a fabrication method thereof.

2. Description of the Background Art

In recent years, inverter units have been widely used in home electric products, industrial power equipment and the like. An inverter unit is, since it usually employs a commercial power supply (an AC power supply), constituted of: a converter section conducting a forward conversion converting an AC power supply to a DC form once; a smoothing circuit section; and an inverter section inversely converting a DC voltage to an AC voltage. In the inverter section, insulated gate bipolar transistors capable of a high speed switching are mainly used as a main power device. In an inverter unit for power control, a current rating and voltage rating handled by each transistor chip are almost in the range of from several A to several hundreds A and in the range of from several hundreds V to several thousands V, respectively, and in a circuit which is operated by continuously altering gate voltages of insulated gate bipolar transistors (IGBT) with a resistance load, a power, which is a product of a current and a voltage, is liberated in the interior of the transistor as heat. With such construction, the circuit requires a large capacity radiator and a conversion efficiency is also degraded, and since a thermal breakdown results due to rise in temperature of the transistors themselves according to a combination of an operating current and operating voltage, a resistance load circuit is not used in many of cases.

Since in many of cases, a load of an inverter unit is an electric induction machine (a motor as an inductive load), an IGBT usually acts as a switch to repeat an off state and an on state, combined, and to thereby control a power energy. In a case where an inverter circuit is switched with an inductive load, stages of the transistor include a turn-off stage where the transistor alters from an on state to an off state, a turn-on stage where the transistor alters from the off state to the on state and a stage where the transistor stays in the on state, wherein a current flowing into the load and the inductive load are connected to an intermediate potential point between the upper arm and lower arm, a current flowing through the inductive load has both directions, positive and negative and a current flowing into the load is returned from a load connection end to the power supply side at a high potential or caused to flow to the ground side; therefore, a necessity arises for free wheeling diodes, which are used in current circulation of a large current flowing through the inductive load between the load and a close circuit of the arms.

In a conventional inverter circuit including IGBTs and free wheeling diodes, free wheeling diodes for current circulation in anti-parallel connection have been used as a separate chip since an IGBT has no bidirectional current flow capability. In recent years, however, a proposal has been made that diodes for current circulation and IGBTs are integrally built as a single piece for the purpose to realize an inverter unit in smaller size and weight (JP-A No. 2000-200906 and JP-A No. 10-74959).

However, there have been problems that a conventional reverse conducting insulated gate bipolar transistor has an anode and cathode on the same plane, that current flow capabilities in both directions are not at the same level, that since an internal diode shares an element for constituting the insulated gate bipolar transistor, it is difficult to optimize a diode characteristic independently, and that especially a recovery characteristic of an internal diode is lower than that of a diode in a case where an IGBT chip and a free wheeling diode chip are combined as a two-chip device.

Carriers accumulated in the junction end region located in the outer peripheral region of the chip cause current concentration in the boundary region with a cell portion while a recovery action works, resulting in another problem of breakdown of the chip.

SUMMARY OF THE INVENTION

It is accordingly an object of the present invention to provide a reverse conducting semiconductor device in which an insulated gate bipolar transistor and a free wheeling diode excellent in recovery characteristic are monolithically formed on a substrate as a single piece and a fabrication method therefor.

A reverse conducting semiconductor device pertaining to the present invention, in order to achieve the object, is a reverse conducting semiconductor device including an insulated gate bipolar transistor and a free wheeling diode which are formed on a substrate made of a first conductive type semiconductor as a single piece, the free wheeling diode including:

a second conductive type base layer formed by doping one surface of the substrate with a second conductive type impurity to constitute the insulated gate bipolar transistor;

a first conductive type base layer of the first conductive type semiconductor for constituting the insulated gate bipolar transistor;

an anode electrode which is an emitter electrode formed on the one surface of the substrate so as to cover a first conductive type emitter layer formed on the part of the second conductive type base layer and the second conductive type base layer;

a cathode electrode which is a collector electrode formed on the other surface of the substrate so as to cover the first conductive type base layer and a second conductive type collector layer formed on the part of the first conductive type base layer, characterized in that a short lifetime region where a lifetime of the carrier is set shorter than the other portion of the first conductive type base layer is formed on a part of the first conductive type base layer.

The reverse conducting semiconductor device pertaining to the present invention with the above construction is a reverse conducting semiconductor device including an insulated gate bipolar transistors and a free wheeling diode which are formed on the substrate as a single piece and a short lifetime region is formed in the part of the first conductive type base layer; therefore, a quantity of carriers swept out from the first conductive type base layer during a recovery operation can be smaller, thereby enabling a reverse recovery characteristic to be improved.

DETAILED DESCRIPTION OF THE PREFERRED EMBODIMENTS

Description will be given of embodiments pertaining to the present invention below with reference to the accompanying drawings.

Embodiment 1

Figure 1:
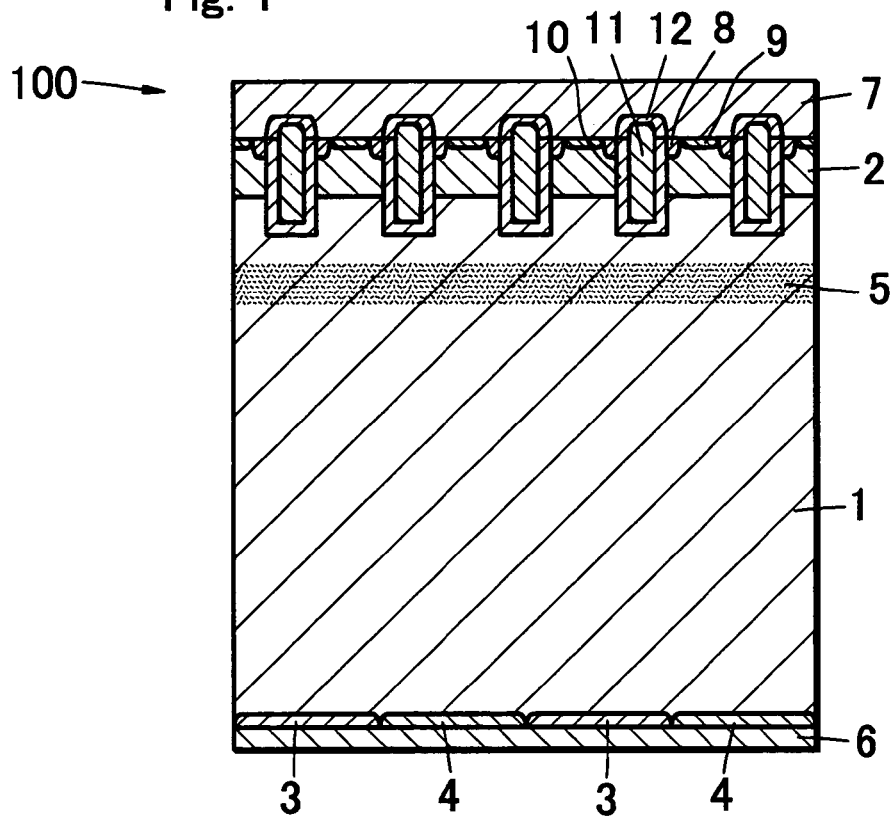
FIG. 1 is a sectional view showing a structure of a reverse conducting semiconductor device of a first embodiment pertaining to the present invention.

A reverse conducting semiconductor device of a first embodiment pertaining to the present invention includes insulated gate bipolar transistors and free wheeling diodes which are monolithically formed on a substrate 1 made of an N type semiconductor (for example, N type silicon semiconductor) as a single piece and is constructed in the following way (FIG. 1).

In a reverse conducting semiconductor device of the first embodiment, insulated gate bipolar transistors include:

(1) a P type base layer 2, (2) $N^+$ emitter layers 8 formed by doping parts of the P type base layer 2 with an N type impurity, (3) $P^+$ type contact layers 9 formed on the P type base layer 2 between adjacent $N^+$ emitter layers 8 by doping parts of the P type base layer 2 with a P type impurity, (4) gate insulating films 10 each formed so as to be in contact with the P type base layer 2, $N^+$ emitter layers 8 and the N type semiconductor of the substrate 1, (5) gate electrodes 11 each formed so as to be opposite the P type base layer 2, $N^+$ type emitter layers 8 and the N type semiconductor of the substrate 1 with the gate insulating film 10 interposed therebetween, and (6) an emitter electrode 7 isolated from the gate electrodes 11 with an interlayer insulating film 12, and formed in contact with the $N^+$ emitter layers 8 and the $P^+$ type contact layers 9, all constituents being formed on one surface of the substrate 1 made of an N type semiconductor;

(7) P type collector layers 3, (8) collector electrodes 6 formed so as to be in contact with the P type collector layers 3, all being formed on the other surface of the substrate 1, wherein the N type semiconductor of the substrate 1 serves as an N type base layer 1a.

Note that details of a structure of the gate electrodes and others on the one surface side of the substrate will be clarified in the course of description of a manufacturing method.

The term "N$^+$ type" of the N$^+$ type emitter layers 8 means that a concentration of an N type impurity is higher therein than the N type semiconductor of the substrate 1 and the "P$^+$ type" of the P$^+$ type contact layers 9 means that a concentration of an P type impurity is higher therein than the P type semiconductor of the P type base layer 2.

In the reverse conducting semiconductor device of the first embodiment, on the other surface of the substrate 1, cathode layers 4 made of an N$^+$ semiconductor are formed adjacent to the respective P type collector layer 3 and the collector electrode 6 is formed so as to be in contact with the cathode layers 4, whereby free wheeling diodes are formed between the emitter electrode 7 and the collector electrode 6 using the PN junction between the P type base layer 2 and the N type semiconductor (an N type base layer 1a) of the substrate 1. Note that the emitter electrode 7 corresponds to the anode electrode of the free wheeling diodes and the collector electrode 6 corresponds to the cathode electrode thereof.

Figure 4:
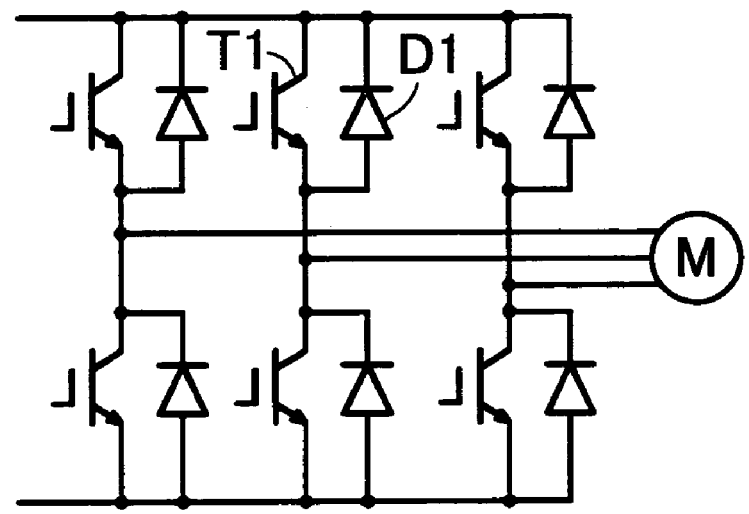
FIG. 4 is a circuit diagram in a case where an inverter circuit is constituted of the reverse conducting semiconductor device of a first embodiment.

The reverse conducting semiconductor device of FIG. 1 with the construction has a structure in which insulated gate bipolar transistors T1 and the free wheeling diodes D1 are connected to one another as shown in FIG. 4, which works as follows. Note that the circuit of FIG. 4 shows an example of configuration of an inverter circuit using the reverse conducting semiconductor device of the present invention.

Description of Workings

In the reverse conducting semiconductor device of FIG. 1, when a positive bias equal to or larger than a threshold value is applied to the gate 11 and a prescribed voltage is applied between the emitter electrode 7 and the collector electrode 11 on the rear surface (the emitter electrode is lower in potential than the collector electrode on the rear surface), the insulated gate bipolar transistors takes an ON state, causing the N type base layer 1a, the P type base layer 2 and the N$^+$ emitter layers 8 to be in a conductive state. On this occasion, the free wheeling diodes are reverse biased and in an OFF state.

In the reverse conducting semiconductor device of FIG. 1, when a negative voltage or a voltage equal to emitter voltage is applied to the gate 11 and a prescribed voltage is applied between the emitter electrode 7 and the collector electrode 6 (the emitter electrode is higher in potential than the collector electrode on the rear surface), the insulated gate bipolar transistors are not in a conductive state, but the free wheeling diodes are forward biased and a current flows from the emitter electrode 7 to the collector electrode 6 through the P$^+$ contact layers 9, the P type base layer 2 and the N type base layer 1a (conducting in a direction opposite that of the insulated gate bipolar transistors).

When the gate 11 is negatively biased and a prescribed voltage is applied between the emitter electrode 7 and the collector electrode 6 on the rear surface (the emitter electrode is lower in potential than the collector electrode on the rear surface), a depletion layer is extended from the P type base layer on the front surface, thereby a withstand voltage can be held and the free wheeling diodes are reversed biased and not conductive.

In this way, in the reverse conducting semiconductor device of the first embodiment, the free wheeling diodes and the insulated gate bipolar transistors share the P type base layer and the N type base layer 1a with each other, and a direction of a current flowing in the insulated gate bipolar transistors in the ON state is opposite that of a current flowing in the free wheeling diodes in the ON state.

Figure 3:
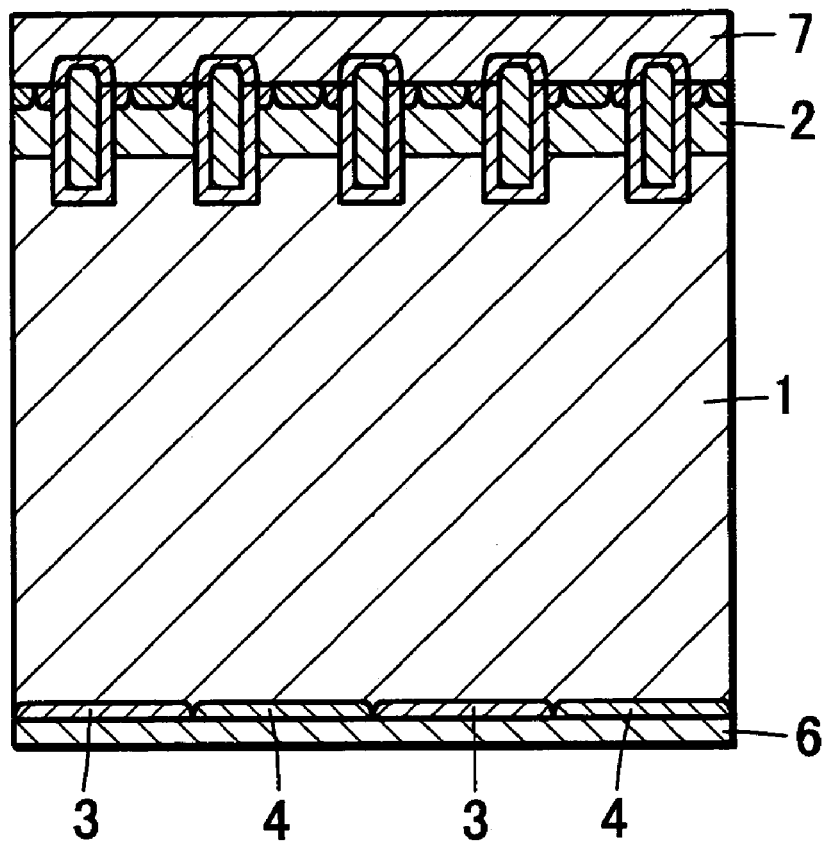
FIG. 3 is a sectional view of a reverse conducting semiconductor device of a comparative example.

In this way, in the reverse conducting semiconductor device of the first embodiment, a structure is adopted in which the P type base layer 2 of the insulated gate bipolar transistors is used as the anode of the free wheeling diodes. In general, since a gate threshold voltage (Vth) of an insulated gate bipolar transistor used in an inverter unit is set at about 5 V, a peak concentration in a portion along the gate insulating films of the P type base layer 2 is set at a value of the order in the range of from $1 \times 10^{17}/cm^3$ to $1 \times 10^{18}/cm^3$ and a concentration of the P type base layer 2 in the device front surface portion is on the order of $1 \times 10^{18}/cm^3$ or more. Therefore, when the free wheeling diodes take the ON state, injection of holes occurs from the P type base layer 2 serving as the anode layer excessively more than necessary and carriers (holes and electrons) accumulate excessively in the N type base layer 1a in the interior of the device. The charge accumulated in the interior of the device is extracted from the device as a reverse recovery current (recovery current) during a reverse recovery operation (a recovery operation) For this reason, in a reverse conducting semiconductor device of a comparative example shown in FIG. 3 where no short lifetime layer 5 is formed, there has been arisen a problem of degradation of a recovery characteristic of the free wheeling diodes in a case where the P type base layer 2 of the insulated gate bipolar transistors is used as the anode of the free wheeling diodes.

Therefore, in the first embodiment, the short lifetime region 5 in which a lifetime of carriers is shorter than the N type base layer 1a except part thereof, is formed on part of the N type base layer 1a located below the P type base layer 2 (part located in the thickness direction of the substrate 1) to thereby reduce excessive carriers by the action of the short lifetime region 5 and to improve a recovery characteristic of the free wheeling diodes.

To be detailed, a recovery characteristic of the free wheeling diode is a characteristic occurring in a case where a reverse bias is applied in a state where carriers are accumulated in a great quantity in the N type base layer 1a while the reverse conducting semiconductor device is in the ON state in the reverse direction (that is, the free wheeling diode is in the ON state), of the carriers accumulated in the N type base layer 1a, holes are extracted into the P type base region 2, while electrons are extracted into the cathode layers 4, which constitutes a reverse recovery current (a recovery current).

In the first embodiment, since the short lifetime region having a shorter lifetime of carriers is formed in a region directly below the P type base layer widening toward the central portion of the substrate 1, a carrier density is lower in a conductive state in the reverse direction, as compared with a case where no lifetime control is implemented. Therefore, a quantity of carriers swept out in a recovery action can be reduced, thereby enabling the absolute value of a reverse recovery current to be suppressed.

During the recovery, a current is not rendered zero immediately after the maximum current flows and a tail current with a large time constant flows. In order to suppress the tail current, a lifetime control has been applied in some cases by platinum diffusion or a uniform electron beam irradiation, whereas in the collector-short type reverse conducting semiconductor device of the first embodiment in which the N type cathode layers 4 is formed in the collector side, since a positive voltage is applied to the collector during the recovery to thereby attract electrons in the interior of the device into the N type cathode layers 4, electrons in the interior of the device are reduced faster to zero as compared with a case where no cathode region exists in the collector; therefore, the tail current can be smaller by the action of the N type cathode layers 4 in the collector side, the absolute value of a reverse recovery current is suppressed and a tail current can be suppressed only by lifetime control in-which a portion closer to the P type base layer 2 is irradiated with helium, which enables a reverse recovery characteristic to be improved.

Figure 2:
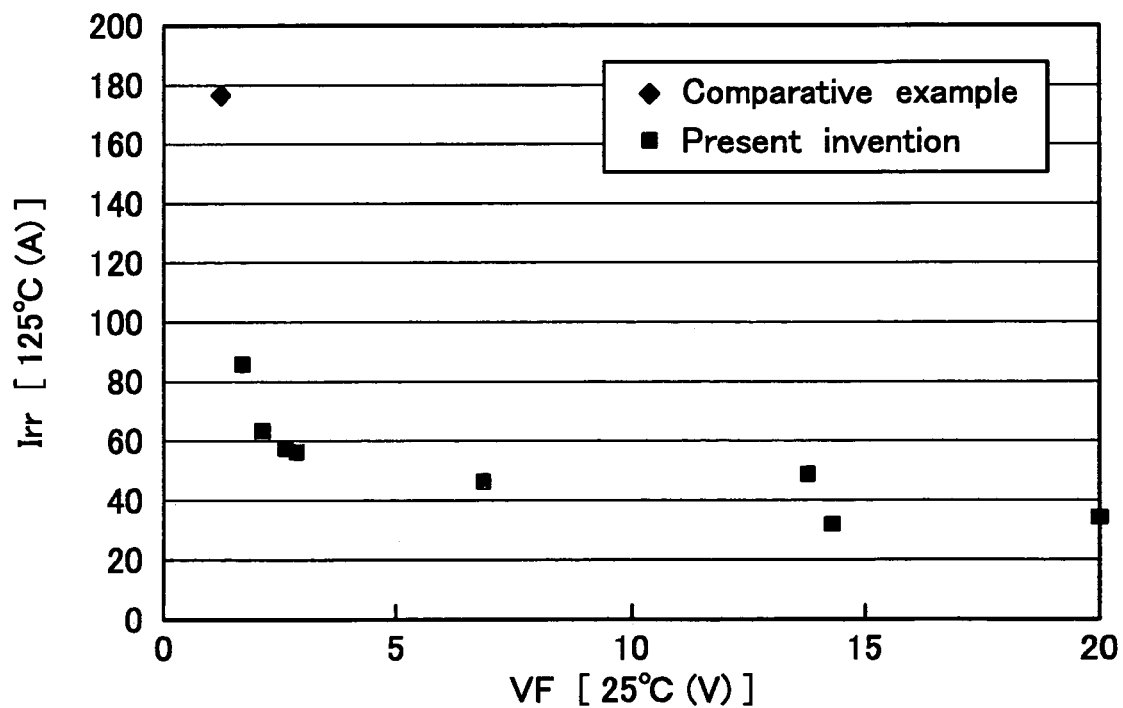
FIG. 2 is a correlation diagram between a forward voltage (VF) and a recovery current of the reverse conducting semiconductor device of a first embodiment.

The present inventors, in order to confirm an effect of improving a recovery characteristic of the free wheeling diode by the action of the short lifetime region 5 and to fabricate as a trial a device of a 1200 V class in a structure of FIG. 1, investigation, wherein a thickness of the N type base layer (an N type semiconductor layer of a substrate) set to 190 μm, is conducted about how a voltage drop (VF) in the forward direction of an internal diode and a recovery peak current (Irr) during a reverse recovery operation alter in the presence or absence of helium irradiation. In FIG. 2, there is shown the results.

Note that plural points in helium irradiation shows results under helium irradiation in different conditions. A depth of he helium irradiation is located at a position in a region closer to the front surface side (closer to the P type base layer 2) than the central portion of the N base layer. It is understood that with helium irradiation applied, a recovery peak current (Irr) decreases despite increase in VF.

Then, description will be given of a fabrication method for the reverse conducting semiconductor device of the first embodiment.

First Step

Figure 5:
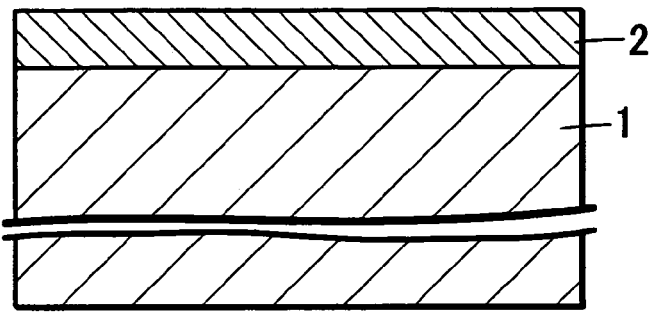
FIG. 5 is a sectional view after a P type base layer is formed in a substrate in a fabrication method for the reverse conducting semiconductor device of a first embodiment.

In the first step, the substrate 1 made of N type silicon is prepared for ready use and a P type impurity is injected through one main surface of the substrate 1 and diffused to thereby form the P type base layer 2 (FIG. 5).

Second Step

Figure 6:
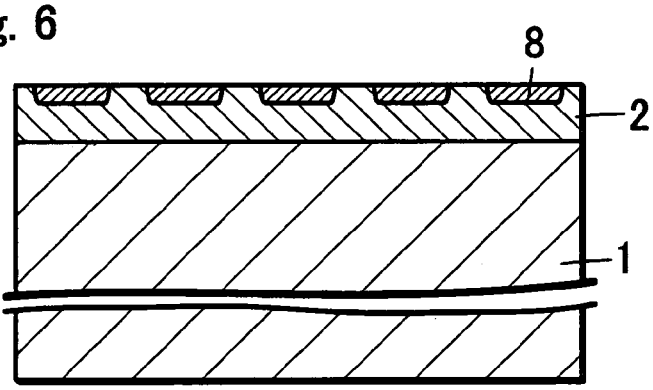
FIG. 6 is a sectional view after $N^+$ type emitter layers are formed in parts of the P type base layer in the fabrication method for the reverse conducting semiconductor device of a first embodiment.

In the second step, an N type impurity is selectively injected through the surface of the P type base layer and diffused to thereby form the $N^+$ type emitter layers 8 (FIG. 6).

Third Step

Figure 7:
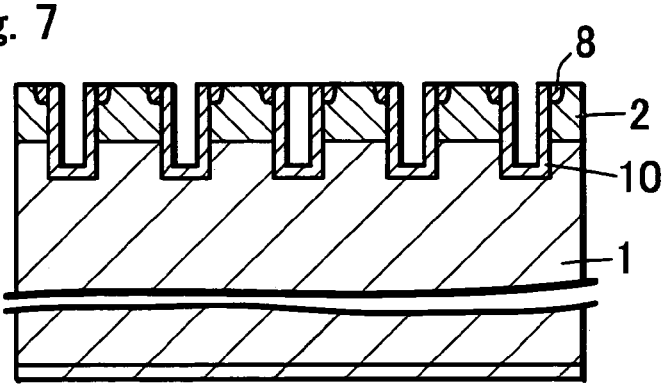
FIG. 7 is a sectional view after grooves for gate electrodes formed through the $N^+$ type emitter layers and the P type base layer and insulating gate films are formed in the grooves in the fabrication method for the reverse conducting semiconductor device of a first embodiment.

In the third step, grooves to reach the N type semiconductor layer of the substrate 1 are formed through the $N^+$ type emitter layers 8 and the P type base layer 2 and the insulating gate films 10 (the trench type insulating films) are formed on the surfaces of the grooves (FIG. 7).

Fourth Step

Figure 8:
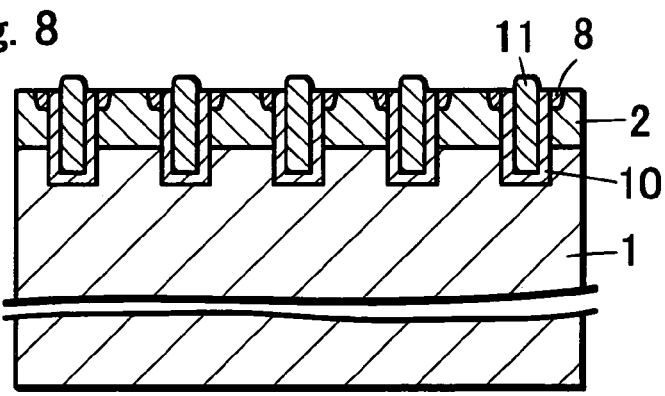
FIG. 8 is a sectional view after gate electrodes are formed on the insulating gate films in the grooves in the fabrication method for the reverse conducting semiconductor device of a first embodiment.

In the fourth step, the gate electrodes 11 made of conductor polysilicon on the respective insulating gate films 10 each in the shape of a trench (FIG. 8).

Fifth Step

Figure 9:
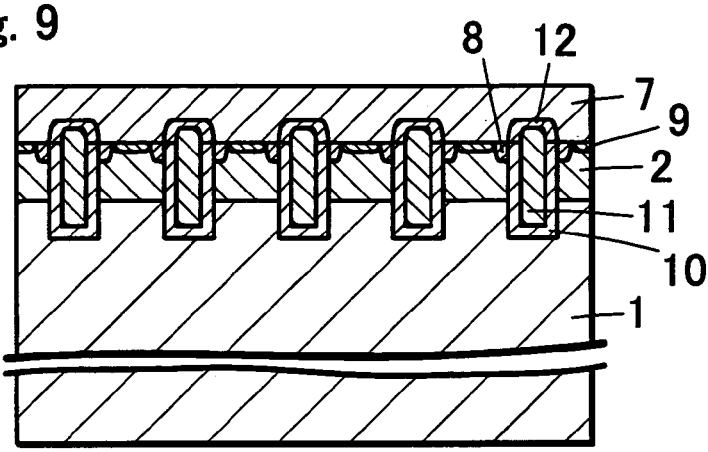
FIG. 9 is a sectional view after an emitter electrode is formed in the fabrication method for the reverse conducting semiconductor device of a first embodiment.

In the fifth step, the $P^+$ type contact layers 9 are formed on the surfaces of the P type base layer 2 between adjacent $N^+$ type emitter layers 8 by injecting or diffusing a P type impurity into the surfaces therebetween and the interlayer insulating films 12 are further formed so as to cover the gate electrodes 11 and thereafter, the emitter electrode 7 is formed so as to be in contact with the $N^+$ type emitter layers 8 and the $P^+$ type contact layers 9 (FIG. 9).

Sixth Step

Figure 10:
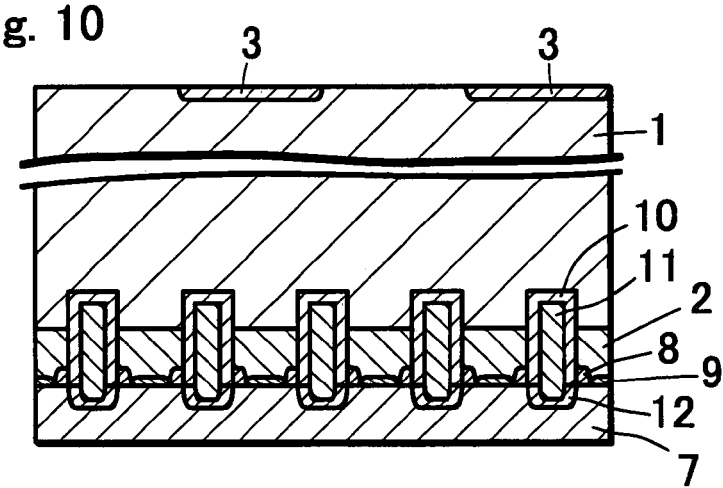
FIG. 10 is a sectional view after P type collector layers formed on the other main surface of the substrate in the fabrication method for the reverse conducting semiconductor device of a first embodiment.

In the sixth step, a P type impurity is selectively injected or diffused into the other main surface of the substrate 1 to form the P type collector layers on the other main surface of the substrate 1 (FIG. 10).

Seventh Step

Figure 11:
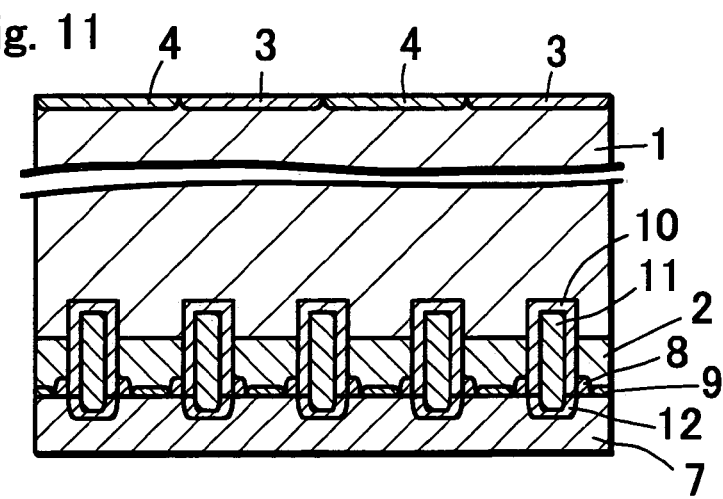
FIG. 11 is a sectional view after cathode layers 4 each are formed between adjacent P type collector layers on the other main surface of the substrate in the fabrication method for the reverse conducting semiconductor device of a first embodiment.

In the seventh step, an N type impurity is selectively injected or diffused in regions between adjacent the P type collector layers 3 on the other main surface of the substrate 1 to form the cathode layers 4 made of an $N^+$ type semiconductor having an N type impurity concentration higher than the N type base layer on the other main surface of the substrate 1 (FIG. 11).

Note that the cathode layers 4 made of $N^+$ type semiconductor are formed in order to reduce an ohmic contact resistance value between the collector electrode 6 and the N type semiconductor of the substrate 1.

Eighth Step

Figure 12:
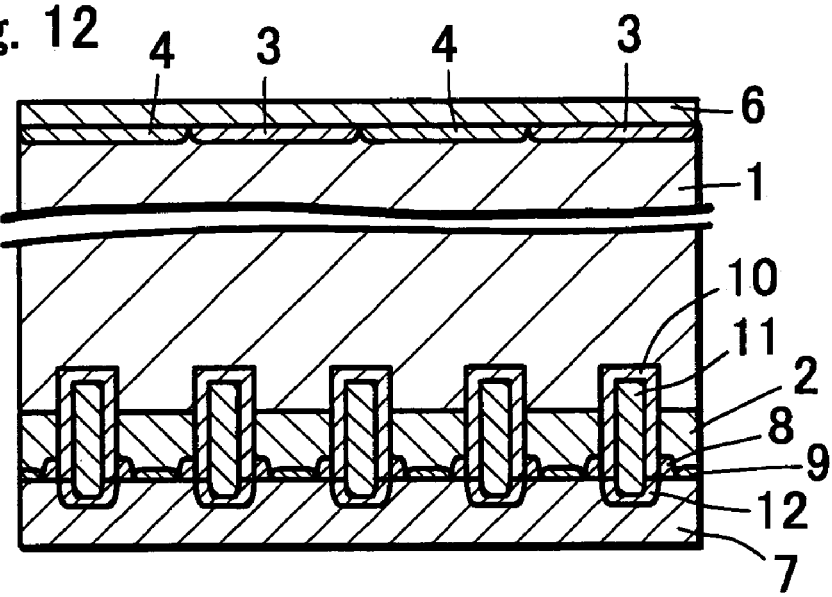
FIG. 12 is a sectional view after a collector electrode is formed on the other main surface in the fabrication method for the reverse conducting semiconductor device of a first embodiment.
Figure 13:
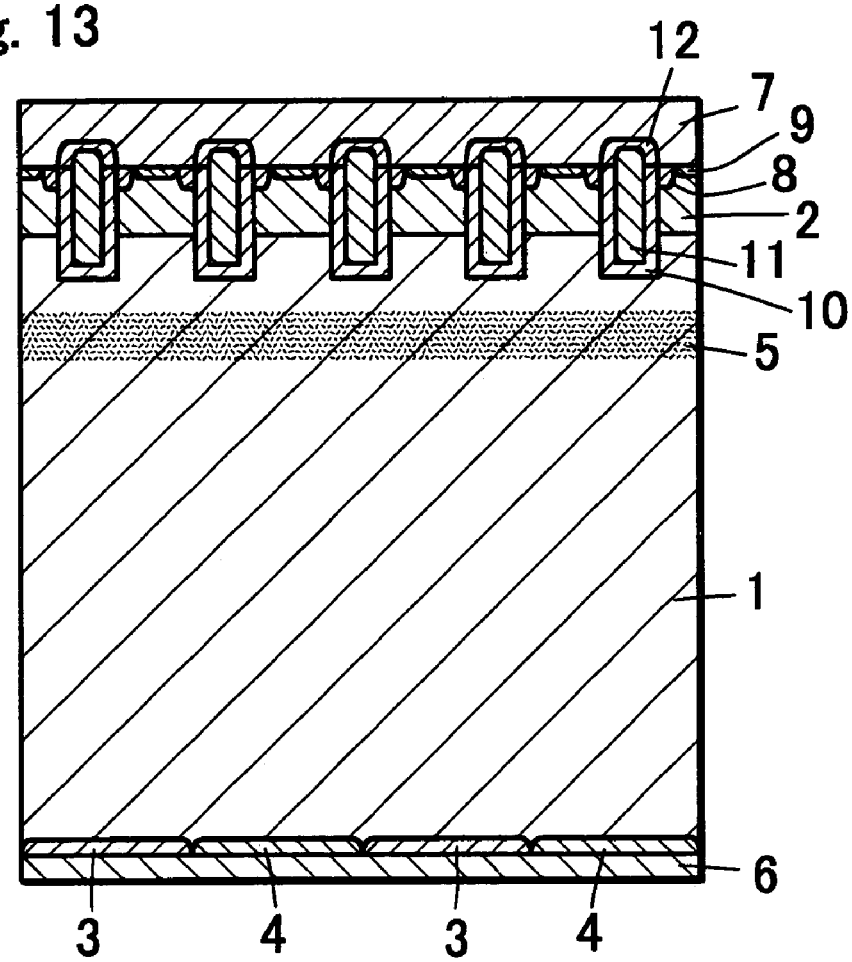
FIG. 13 is a sectional view after a short lifetime region is formed in the fabrication method for the reverse conducting semiconductor device of a first embodiment.

In the eighth step, the collector electrode 6 in ohmic contact with the P type collector layers 3 and the cathode layers 4 is formed on the other main surface of the substrate 1 (FIG. 12).

Ninth Step

In the ninth step, the one main surface of the substrate 1 is irradiated with helium to form the short lifetime region (the helium irradiated region) 5 locally in the interior of the N type base layer 1a (lifetime control).

Note that in the lifetime control step, a range of helium is preferably adjusted so that the short lifetime region 5 is formed in a region closer to the one main surface than the central portion of the N type base layer 1a and an irradiation dose of helium is set so as to obtain a desired recovery characteristic while increase in Vf is effectively suppressed.

In the first embodiment, since the short lifetime region 5 is formed by helium irradiation, the short lifetime region 5 can be surely formed at a desired position.

With the above process applied, the reverse conducting semiconductor device of the first embodiment can be fabricated.

As detailed above, since the reverse conducting semiconductor device of the first embodiment is constituted of the insulated gate bipolar transistors and the free wheeling diodes with the P type base layer and the N type base layer 1a as common elements, a structure is easy and simple and by forming the short lifetime region 5 in part of the N type base layer 1a, a recovery characteristic of the free wheeling diodes can be good.

Since the reverse conducting semiconductor device of the first embodiment has a trench structure in which grooves are formed through the $N^+$ type emitter layers 8 and the P type base layer 2 to thereby form the gate electrodes 11, it is possible to increase the number of gates in terms of repetition pitch to thereby increase a channel width.

Note that in the first embodiment, an N type is a first conductive type and a P type is a second conductive type, the present invention is not limited thereto and conductive types may be reversed.

Embodiment 2

Description will be given of a reverse conducting semiconductor device of a second embodiment pertaining to the present invention below with reference to FIG. 14.

A reverse conducting semiconductor device of the second embodiment includes insulated gate bipolar transistors and free wheeling diodes are monolithically formed on a substrate 1 made of an N type semiconductor as a single piece and an electric field relaxation region 200 having a junction section end structure to relax an electric field in a peripheral portion during operation around an operating region 100 in which the insulated gate bipolar transistors and the free wheeling diodes formed as a single piece.

Note that since in the reverse conducting semiconductor device of the second embodiment, the operating region 100 is constructed in a similar way to that adopted in the first embodiment with the exception that no short lifetime region 5 is formed in the operating region 100, detailed description of the operating region 100 is omitted. In FIG. 14, similar numbers are attached to similar constituents to those in FIG. 1.

In the second embodiment, the junction section end structure of the electric relaxation region 200 are of a construction in which plural ring P type wells 13 are formed so as to surround the operating region 100 and a spacing between adjacent P type well layers is wider toward the outer side.

Electrodes 15 isolated from one another are formed on the respective P type well layers 13 and a protective film 16 is formed so as to cover the plural P type well layers 13 and the electrodes 15. In this way, the electric field relaxation region 200 constituted of the junction section end structure constructed with the plural P type well layers 13 reduces the electric field strength that would be otherwise concentrated at the end portion of the operating region 100 gradually toward the outer side to thereby prevent a breakdown at the end of the operating region 100.

Note that the junction section end structure of the electric field relaxation region 200 is not limited to a structure in which plural P type well layers are formed, but may be replaced with another electric field relaxation structure such as a RESURF structure in which P type layers with a medium concentration are formed.

With such a junction section end structure adopted, a breakdown due to concentration of an electric field at the end portion of the operating region 100 during a positive conducting operation or a reverse conducting operation, whereas a breakdown to occur at the end portion of the operating region 100 cannot be avoided in transition from the positive conducting operation to the reverse conducting operation and vice versa.

That is, it is impossible to prevent a breakdown at the end portion of the operating region 100 caused by flowing carriers accumulated in the N type semiconductor (the N type conductor of the substrate) of the electric field relaxation region 200 during the reverse direction conducting operation in which the free wheeling diodes are in a conductive state into the P type base layer 2 when change-over occurs to a forward direction blocking operation (in a recovery action of the free wheeling diodes).

Therefore, in the second embodiment, the short lifetime region 17 is formed directly below the junction section end structure including the plural P well layers 13 by electron beam irradiation to thereby decrease carriers accumulated in the N type semiconductor of the electric field relaxation region 200 during the reverse direction conducting operation in which the free wheeling diodes are in conductive to thereby prevent a breakdown due to carrier flowing-in in transition from the reverse direction conducting operation to the forward direction conducting operation.

Note that since workings of the insulated gate bipolar transistors and the free wheeling diodes in the operating region 100 are similar to those in the first embodiment, description of the fundamental operation is omitted.

Figure 15:
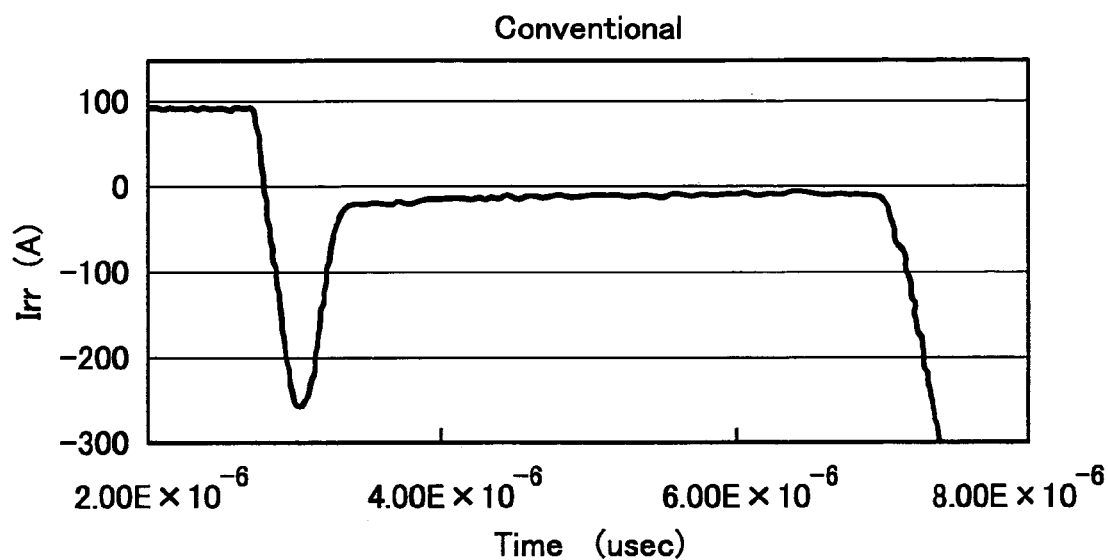
FIG. 15 is a graph showing a recovery characteristic in a case where no irradiation occurs with electron beam in the structure of the reverse conducting semiconductor device of a second embodiment.
Figure 16:
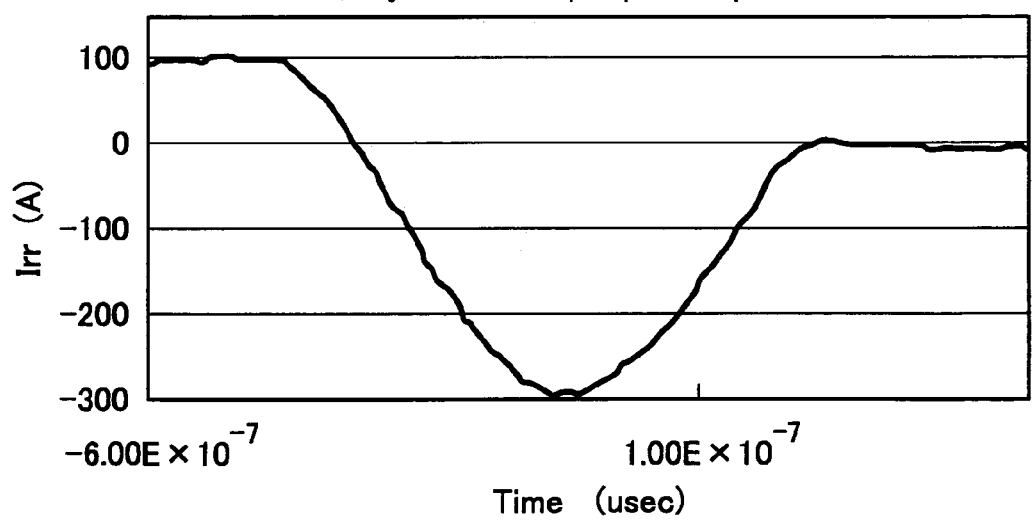
FIG. 16 is a graph showing a recovery characteristic of the reverse conducting semiconductor device of a second embodiment on which irradiation with an electron beam is selectively conducted.

In the second embodiment, in order to confirm an effect of forming the short lifetime region 17, a device of a 1200 V class was fabricated as a trial for evaluation. To be detailed, a thickness of the N type base layer 1a (an N type semiconductor layer) is set to 190 μm to fabricate a device of a 1200 V class and to evaluate recovery characteristics in a case where a region directly below the junction section end structure was irradiated with an electron beam and in a case where the region was not irradiated with an electron beam. In FIG. 15, there is shown a recovery characteristic in the case where the region directly below the junction section end structure was not irradiated with an electron beam and in FIG. 16, there is shown a recovery characteristic in the case where the region directly below the junction section end structure was irradiated with an electron beam. It is understood from FIGS. 15 and 16 that no chip is broken down during the recovery operation in the case where the region directly below the junction section end structure was irradiated with an electron beam.

Detailed description will be given of a mechanism of this breakdown and prevention thereof.

When the reverse conducting semiconductor device is at first turned on in the reverse direction (that is, the free wheeling diode is turned on), carriers are accumulated in the N type semiconductor layer to a great quantity. Then, since if a change-over (a recovery operation) is made in the state where carriers are accumulated in a great quantity, the reverse bias is applied in the state where carriers are accumulated in a great quantity; therefore, of the carrier accumulated in the N type semiconductor layer, holes are extracted into the P type base region 2 of the operating region 100, while electrons are extracted into the collector region 4, whereby a large reverse recovery current (a recovery current) flows. During this recovery operation, in the reverse conducting semiconductor device with the construction as shown in FIG. 14, the emitter regions 8 are formed in contact with the P type base layer 2, which constitutes a parasitic thyristor; therefore, there arises a chance of a breakdown due to a latch-up action of the parasitic thyristor.

Therefore, in the second embodiment, a region directly below the P well layers 13 constituting the junction section end structure is selectively irradiated with an electron beam to form the short lifetime region 17, and thereby not only are carriers reduced in the short lifetime region 17, but the carriers are concentrated in the operating region 100 directly below the insulated gate bipolar transistors in the ON state in the reverse direction to thereby suppress holes to flow in a concentrated manner from the short lifetime region 17 at the junction section end structure to the P type base layer 2 under the reverse bias applied.

With such a mechanism effected, in the second embodiment, a breakdown during the recovery operation of the free wheeling diodes can be suppressed.

Description will be given of a fabrication method for the reverse conducting semiconductor device of the second embodiment below with reference to FIGS. 17 to 27.

First Step

Figure 17:
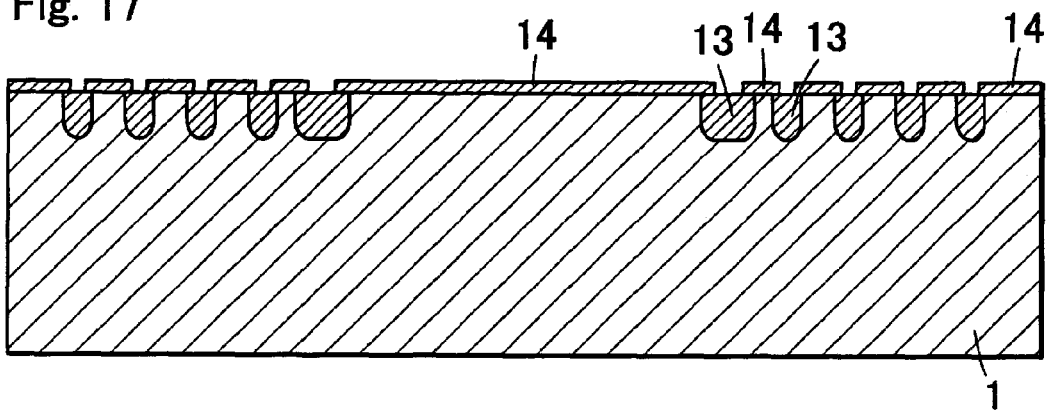
FIG. 17 is a sectional view after P wells are formed on the substrate in a fabrication method for the reverse conducting semiconductor device of a second embodiment.

In the first step, the substrate 1 made of N type silicon is prepared so as to be ready for use and a mask 14 having openings for forming the P well layers 13 therethrough are formed to selectively inject a P type impurity through the openings of the mask 14 for formation of the P well layers 13. Note that the P well layers 13 may be formed by selectively diffusing the P type impurity (FIG. 17).

Second Step

Figure 18:
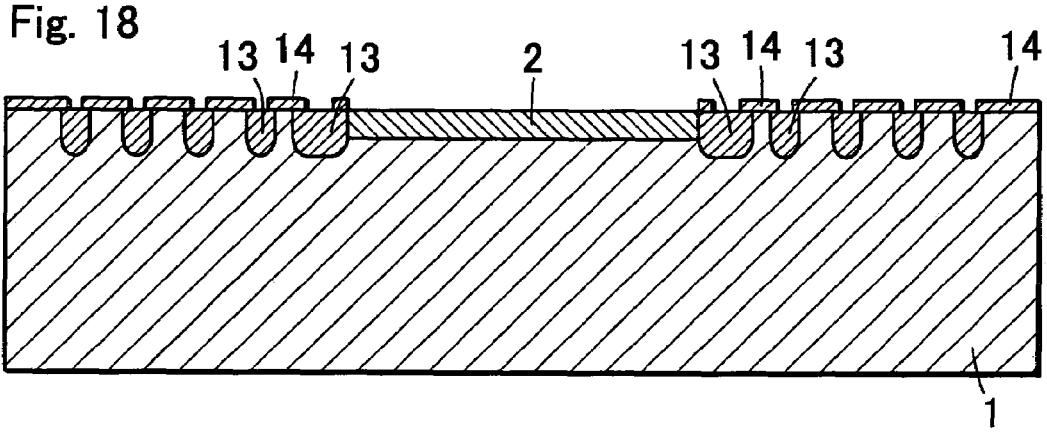
FIG. 18 is a sectional view after a P type base layer is formed in the fabrication method for the reverse conducting semiconductor device of a second embodiment.

In the second step, the mask 14 located on the operating region 100 is removed and a P type impurity is selectively injected or diffused through the removed portion to thereby form the P type base layer 2 (FIG. 18).

Third Step

Figure 19:
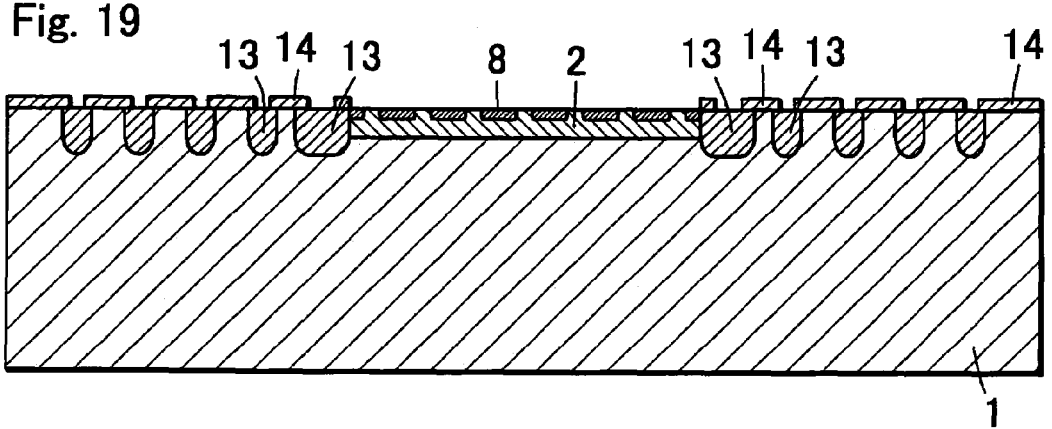
FIG. 19 is a sectional view after $N^+$ type emitter layers are formed in the fabrication method for the reverse conducting semiconductor device of a second embodiment.

In the third step, an N type impurity is selectively injected through the surface of the P type base layer 2 for diffusion to thereby form the N$^+$ type emitter layers 8 (FIG. 19).

Fourth Step

Figure 20:
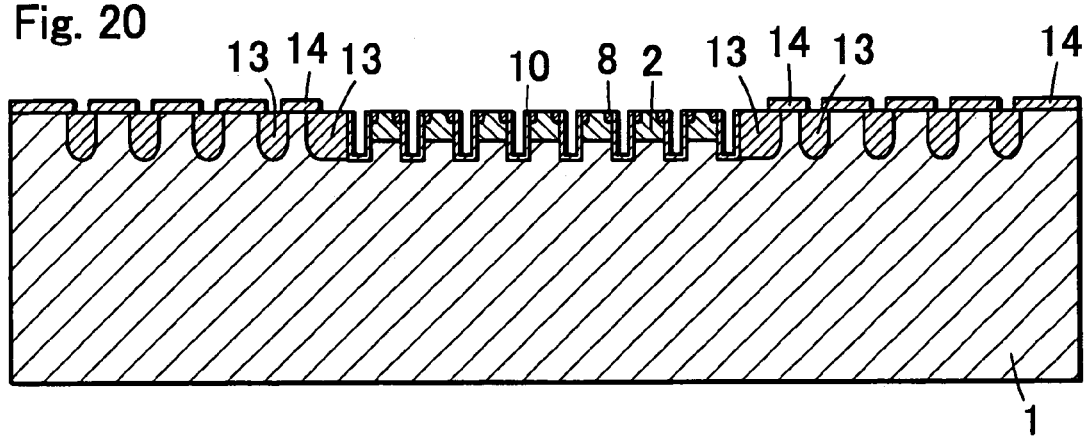
FIG. 20 is a sectional view after insulating gate layers (trench type insulating films) are formed in the fabrication method for the reverse conducting semiconductor device of a second embodiment.

In the fourth step, formed are grooves reaching as far as the N type semiconductor layer of the substrate 1 through the N+ type emitter layers 8 and through the P type base layer 2, and formed are insulating gate films 10 (trench type insulating films) on the grooves (FIG. 20).

Fifth Step

Figure 21:
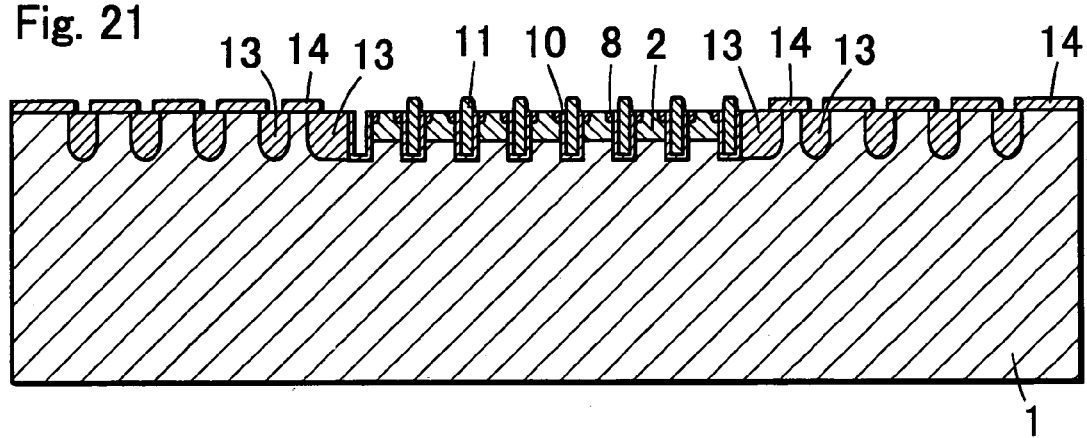
FIG. 21 a sectional view after gate electrodes made of polysilicon are formed in the fabrication method for the reverse conducting semiconductor device of a second embodiment.

In the fifth step, the gate electrodes 11 made of polysilicon, which is dielectric, are formed on the insulating films 10 each in the shape of a trench (FIG. 21).

Sixth Step

Figure 22:
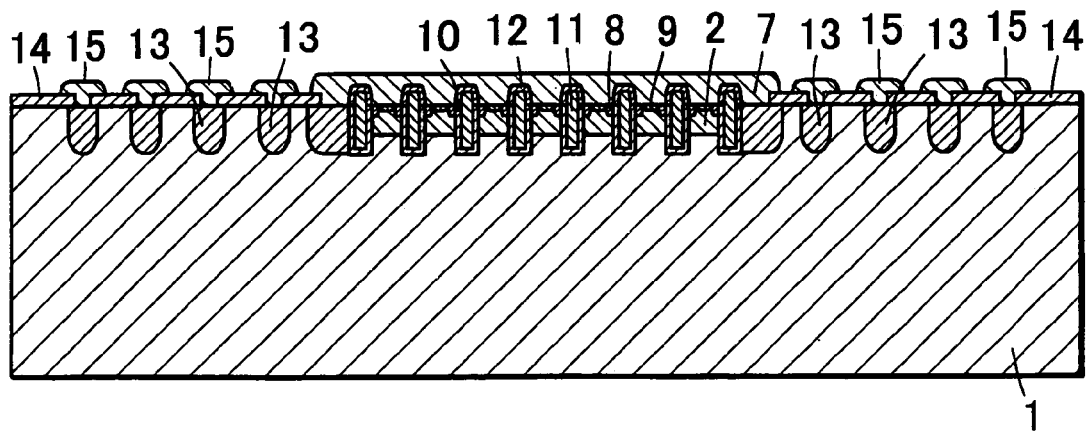
FIG. 22 is a sectional view after emitter electrodes are formed in the fabrication method for the reverse conducting semiconductor device of a second embodiment.

In the sixth step, a P type impurity is selectively injected or diffused into the surfaces of the P type base layer 2 between adjacent N+ emitter layers 8 to form the P+type contact layers 9, besides, the interlayer insulating films 12 are formed so as to cover the gate electrodes 11, thereafter, the emitter electrode 7 is formed so as to be in contact with the N+ emitter layers 8 and the P+ type contact layers 9 and the electrodes 15 are formed on the respective P well layers 13 (FIG. 22).

Seventh Step

Figure 23:
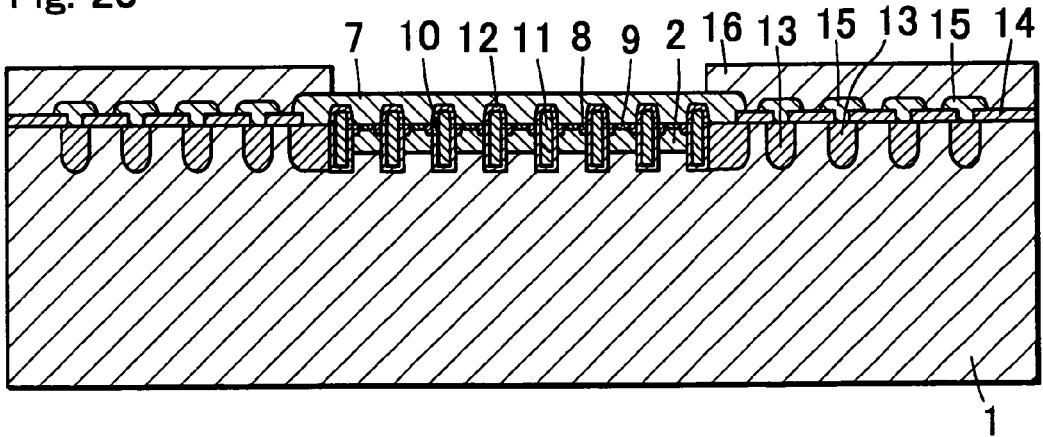
FIG. 23 is a sectional view after a protective film is formed so as to cover P wells and electrodes in the fabrication method for the reverse conducting semiconductor device of a second embodiment.

In the seventh step, the protective film 16 is formed on the surface of the substrate 1 of the electric field relaxation region 200 so as to cover the P well layers 13 and the electrodes 15 (FIG. 23).

Eighth Step

Figure 24:
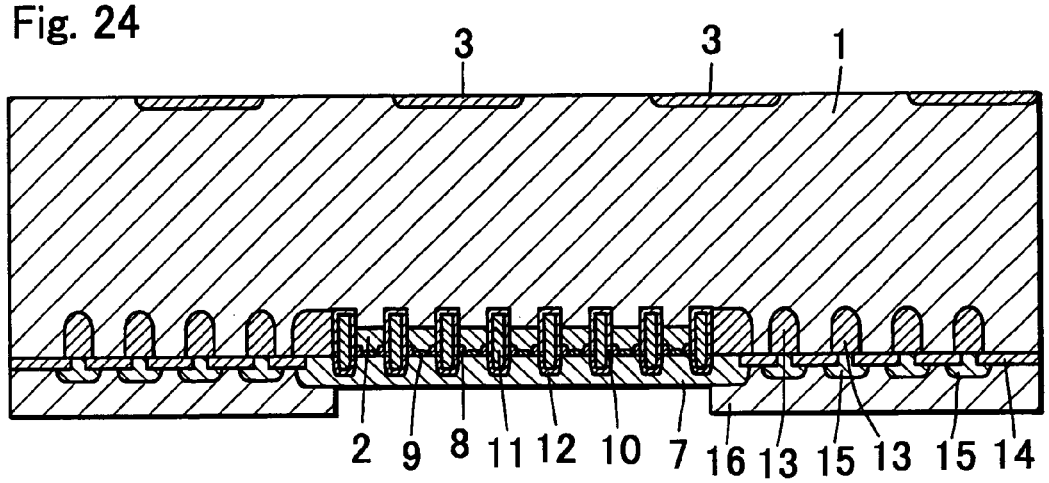
FIG. 24 is a sectional view after P type collector layers are formed on the other main surface of the electrode in the fabrication method for the reverse conducting semiconductor device of a second embodiment.

In the eighth step, a P type impurity is selectively injected or diffused into the other main surface of the substrate 1 to form the P type collector layers 3 on the other main surface of the substrate 1 (FIG. 24).

Ninth Step

Figure 25:
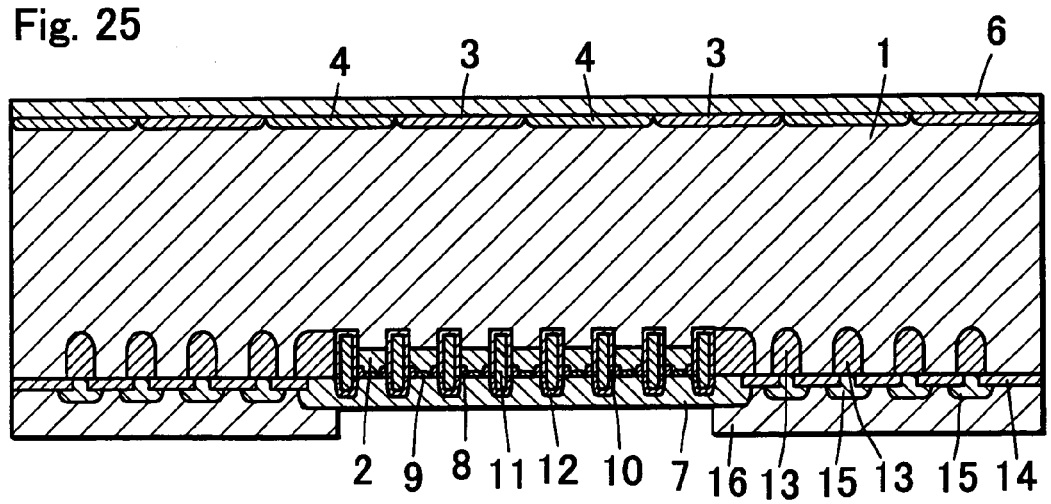
FIG. 25 is a sectional view after a collector electrode in ohmic contact with the P type collector layers and cathode electrodes is formed in the fabrication method for the reverse conducting semiconductor device of a second embodiment.

In the ninth step, an N type impurity is selectively injected or diffused in the regions between adjacent P type collector layers 3 to form the cathode layers 4 made of N type layers including an N type impurity at a high concentration on the other main surface of the substrate 1 and besides, the collector electrode 6 is formed on the other main surface of the substrate 1 in ohmic contact with the P type collector layers 3 and the cathode layers 4 (FIG. 25).

Tenth Step

Figure 26:
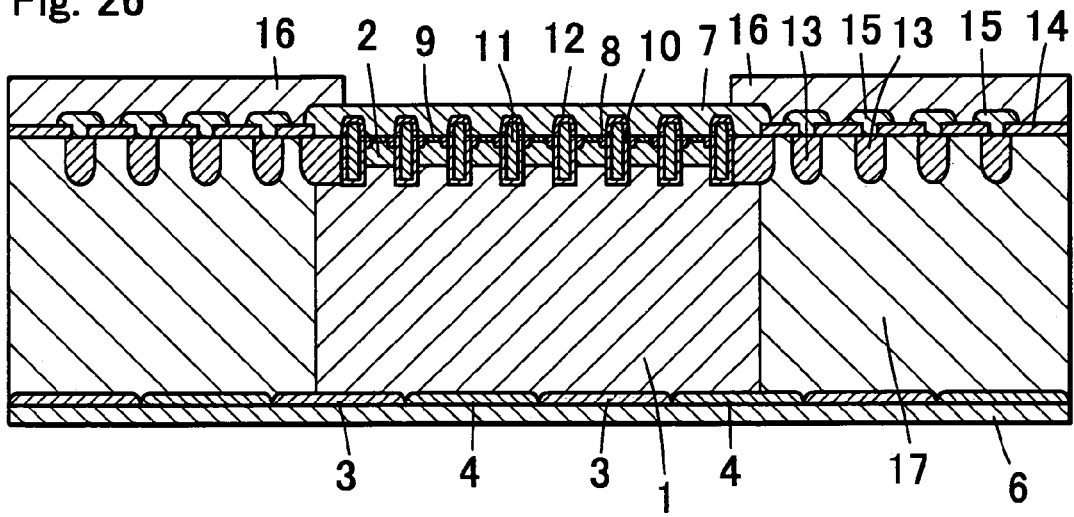
FIG. 26 is a sectional view after a short lifetime region is formed by irradiation of an electric field relaxation region with an electron beam in the fabrication method for the reverse conducting semiconductor device of a second embodiment.

In the tenth step, the electric field relaxation region 200 except the operating region 100 is irradiated with an electron beam through the first main surface side to conduct selective lifetime control for the electric field relaxation region 200 to form the short lifetime region 17 (FIG. 26).

In the tenth step, since the short lifetime region 17 is formed by electron irradiation, the short lifetime region 17 controlled so as to have a desired lifetime can be formed.

Figure 14:
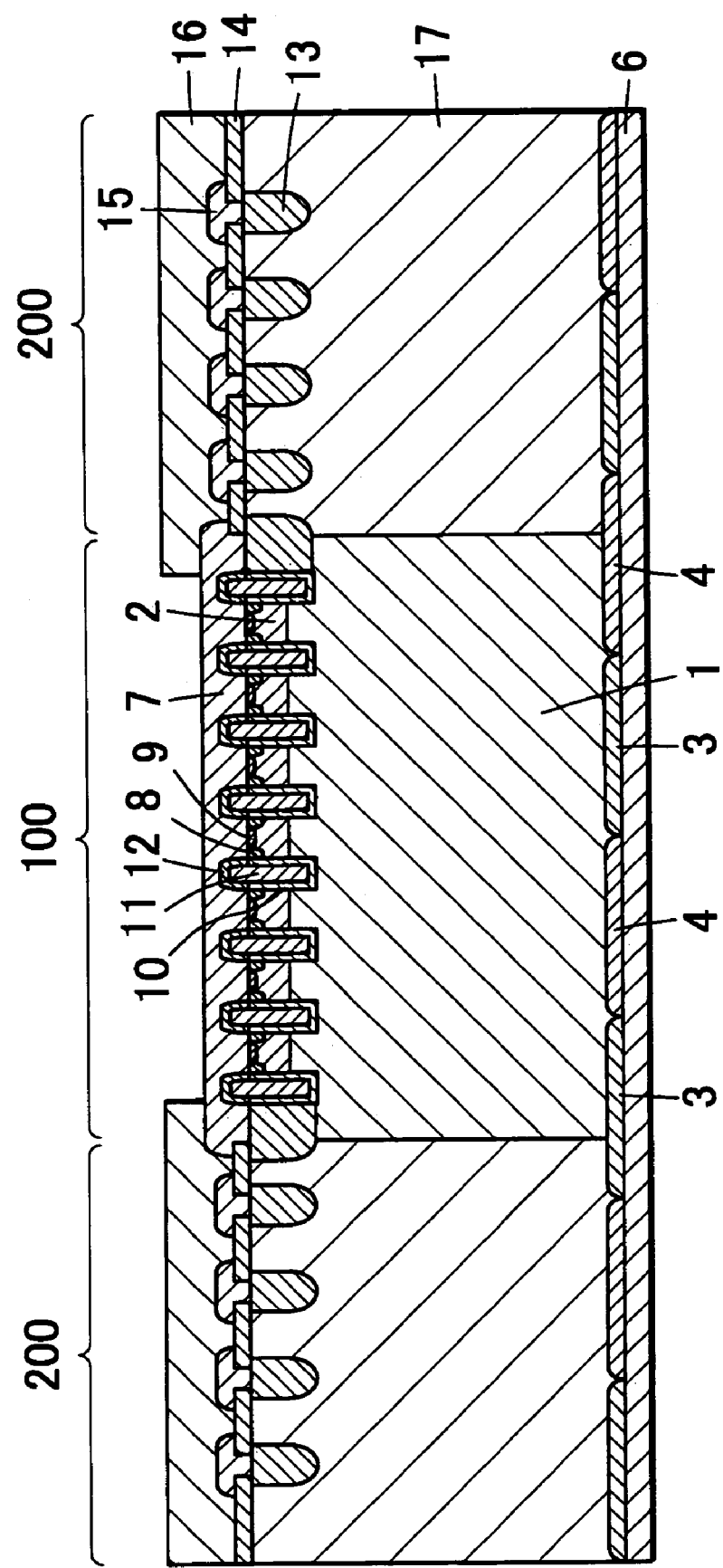
FIG. 14 is a sectional view showing a structure of a reverse conducting semiconductor device of a second embodiment pertaining to the present invention.

With the above process applied, the reverse conducting semiconductor device of the second embodiment of FIG. 14 can be fabricated.

Since the reverse conducting semiconductor device with the above construction has the short lifetime region 17 in the N type semiconductor layer present in the electric field region 200 controlled so as to shorten a carrier lifetime in the N type semiconductor layer, accumulation of carriers are suppressed in the N type semiconductor layer present in the electric field relaxation region 200 during a period when the free wheeling diodes are in the ON state. Therefore, in the recovery operation of the free wheeling diodes, a reverse recovery current (a recovery current) at the end portion of the operating region 100 can be smaller, thereby enabling a breakdown to be caused by a latch-up action of the parasitic thyristor to be prevented.

Note that while in the second embodiment, an N type is the first conductive type and a P type is the second conductivity, the present invention is not limited thereto and conductive types may be reversed.

Embodiment 3

Figure 27:
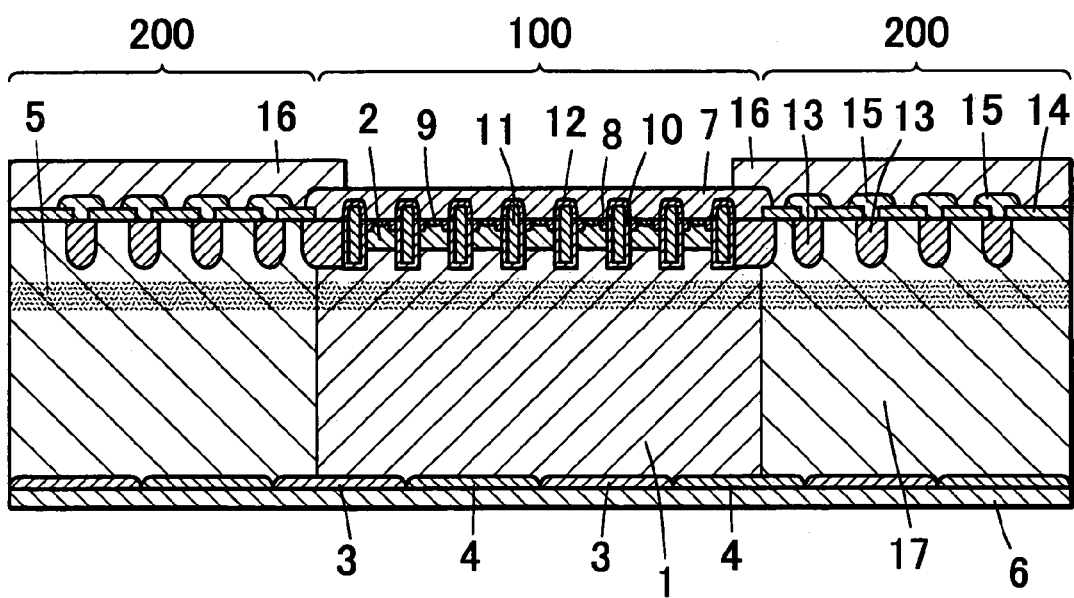
FIG. 27 is a sectional view showing a structure of a reverse conducting semiconductor device of a third embodiment pertaining to the present invention.

A reverse conducting semiconductor device of a third embodiment pertaining to the present invention is fabricated in a similar way to that adopted in the second embodiment with the exception that in the reverse conducting semiconductor device of the second embodiment, helium irradiation was further applied to form a short lifetime region 5, which is similar to that in the first embodiment (FIG. 27).

Figure 28:
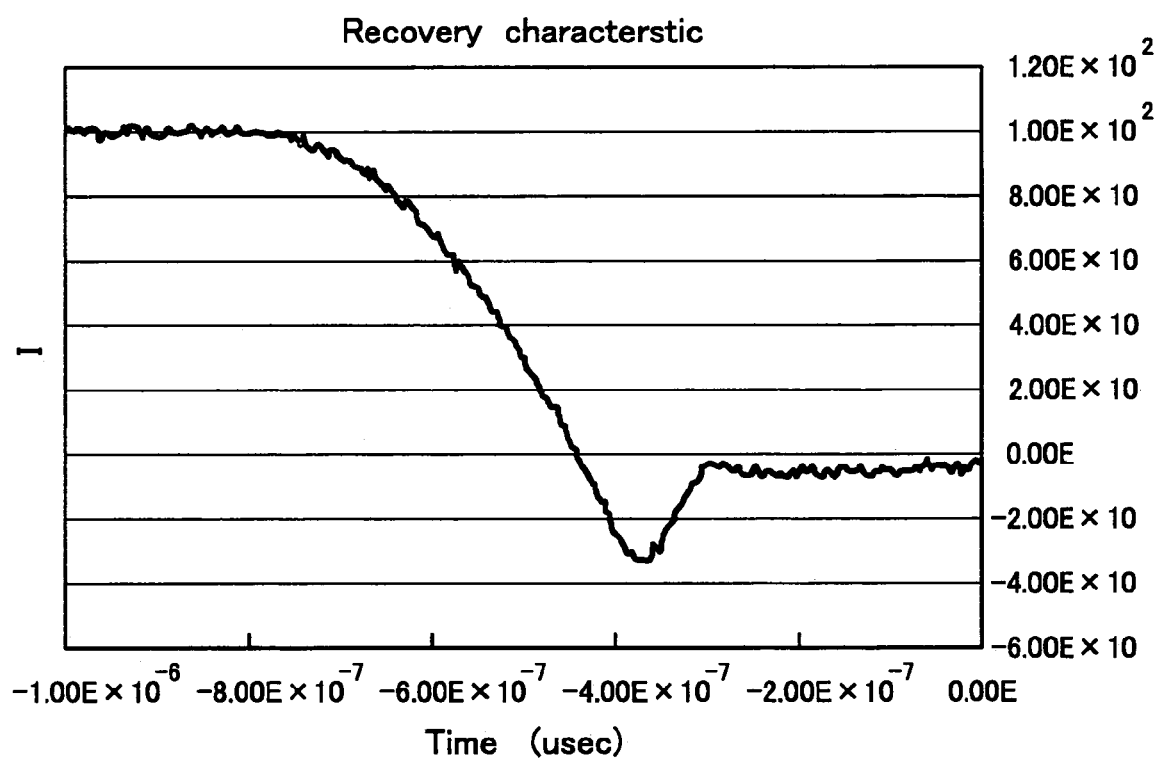
FIG. 28 is a graph showing a recovery characteristic in the reverse conducting semiconductor device in a third embodiment after irradiation is selectively conducted with an electron beam, followed by helium irradiation.

In order to confirm an effect of the reverse conducting semiconductor device of the third embodiment, a device of a 1200 V class was fabricated as a trial for evaluation. To be detailed, a thickness of the N type semiconductor layer is set to 190 μm and a region directly below of the junction section end structure is irradiated with an electron beam as lifetime control for all the N type semiconductor layer present in the electric field relaxation region and helium irradiation is applied in a similar way to that adopted in the first embodiment, in which case a recovery characteristic was then evaluated. In FIG. 28, there are shown results of the evaluation. In the case where electron beam irradiation was applied to the junction section end structure and at the same time, helium irradiation was applied, the chip was not broken down during the recovery operation, and it is understood that since a depth of helium irradiation is closer to the front surface side than the center portion of the N type base layer, a recovery peak current (Irr) is smaller though VF is slightly increases.

The reverse conducting semiconductor device of the third embodiment can be obtained as the device of FIG. 27 in a procedure in which after the device is fabricated in a similar way to that adopted in the second embodiment through the process as far as FIG. 26 and then, local lifetime control with helium is applied through the front surface side in a region in the neighborhood of the center of the substrate.

The reverse conducting semiconductor device of the third embodiment with the above construction has the effects of the first embodiment and the second embodiment together. That is the insulated gate bipolar transistors and the free wheeling diodes are integrally formed as a single piece with the P type base layer 2 and the N type base layer 1a as common elements and the short lifetime region 5 is formed in part of the N type base layer 1a, thereby enabling a recovery characteristic of the free wheeling diodes to be good.

By forming the N type semiconductor layer present in the electric field relaxation region 200 as the short lifetime region 17, the reverse recovery current (recovery current) at the end portion of the operating region 100 during the recovery operation can be smaller, thereby enabling a breakdown to be caused by a latch-up action of a parasitic thyristor to be prevented.

What is claimed is:

1. A reverse conducting semiconductor device comprising an insulated gate bipolar transistor and a free wheeling diode which are formed on a substrate made of a first conductive type semiconductor, said the free wheeling diode comprising;

a second conductive type base layer formed by doping the one surface of said substrate with second conductive type impurities to constitute the insulated gate bipolar transistor, a first conductive type base layer of said first conductive type semiconductor for constituting said insulated gate bipolar transistor, an anode electrode which is an emitter electrode formed on said one surface of said substrate so as to cover a first conductor type emitter layer formed on the part of the second conductive type base layer and the second conductive type base layer, a cathode electrode which is a collector electrode formed on the other surface of the substrate so as to cover the first conductor type base layer and a second conductive type collector layer formed on the part of the first conductor type base layer, wherein a short lifetime region where a lifetime of the carrier is set shorter than the other portion of the first conductive type base layer is formed on a part of the first conductive type base layer.

2. The reverse conducting semiconductor device according to claim 1, wherein said short lifetime region is formed in a region closer to the one main surface than the central portion.

3. The reverse conducting semiconductor device according to claim 1, wherein said collector electrode is connected to said first conductive type base layer through a cathode layer which is doped with the first type impurities more than that of said first conductive type base layer.

4. The reverse conducting semiconductor device according to claim 1, wherein said first conductor type emitter layer is formed by doping parts of said second conductive type base layer with the first conductive type impurities, wherein a gate electrode of said insulated gate bipolar transistor is formed in a groove through a insulating gate film, said groove being formed so as to penetrate said first conductive type emitter layer and said second conductive type base layer.

5. The reverse conducting semiconductor device according to claim 1, wherein said short lifetime region is formed by helium irradiation.

6. The reverse conducting semiconductor device according to claim 1, wherein in the substrate an electric field relaxation region is formed around an operation region where said insulated gate bipolar transistor and said free wheeling diode are formed, wherein a lifetime of the carrier of a first conductive type semiconductor of said electric field relaxation region is shorter than that of the other first conductive type semiconductor.

7. A reverse conducting semiconductor device comprising an insulated gate bipolar transistor and a free wheeling diode which are monolithically formed on a substrate made of a first conductive type semiconductor, said the free wheeling diode comprising;

a second conductive type base layer formed by doping one surface of said substrate with second conductive type impurities to constitute said insulated gate bipolar transistor, a first conductive type base layer of a first conductive type semiconductor for constituting said insulated gate bipolar transistor, an anode electrode which is an emitter electrode formed on said one surface of said substrate so as to cover a first conductor type emitter layer formed on the part of said second conductive type base layer and said second conductive type base layer, a cathode electrode which is a collector electrode formed on the other surface of said substrate so as to cover said first conductor type base layer and an second conductive type collector layer formed on the part of said first conductor type base layer, wherein in the substrate an electric field relaxation region is formed around an operation region where said insulated gate bipolar transistor and said free wheeling diode are formed, wherein a lifetime of the carrier of the first conductive type semiconductor of said electric field relaxation region is shorter than that of the other first conductive type semiconductor.

8. The reverse conducting semiconductor device according to claim 7, wherein said electric field relaxation region is formed by electron beam irradiation.

9. A method for producing a reverse conducting semiconductor device composed of an insulated gate bipolar transistor and a free wheeling diode which are monolithically formed on a substrate made of a first conductive type semiconductor, said method comprising;

a first step for forming a second type conductive type base layer by doping one main surface of a substrate with second conductive type impurities, a second step for forming a first type conductive type emitter layer by doping parts of said second conductive type base layer with first conductive type impurities, a third step for forming an emitter electrode on said second conductive type base layer and said first conductive emitter layer, a fourth step for forming a second collector layer by selectively doping the parts of the other surface of said substrate with second conductive type impurities, a fifth step for forming a cathode layer by selectively doping second parts except for said first parts with first conductive type impurities, a sixth step for irradiating helium into the substrate with a range over said second conductive type base layer.

10. The method for producing a reverse conducting semiconductor device according to claim 9, wherein said second type conductive type base layer, said first type conductive type emitter layer, said second conductive type collector layer and said cathode layer are formed in an operation region of the substrate, further comprising an step for irradiating electron beam to the first conductive type semiconductor positioned on around said operation region of the substrate instead of said sixth step.

11. The method for producing a reverse conducting semiconductor device according to claim 10, further comprising a step for irradiating helium into said substrate of said operation region with a range over said second conductive type base layer.

* * * * *